United States Patent
Lu

(10) Patent No.: US 11,215,654 B2
(45) Date of Patent: Jan. 4, 2022

(54) MEASURING DEVICE, MEASURING SYSTEM, AND MEASURING METHOD FOR LIQUID CRYSTAL DIELECTRIC CONSTANT

(71) Applicant: BOE Technology Group Co., Ltd., Beijing (CN)

(72) Inventor: Yongchun Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 202 days.

(21) Appl. No.: 16/487,245

(22) PCT Filed: Feb. 1, 2019

(86) PCT No.: PCT/CN2019/074449
§ 371 (c)(1),
(2) Date: Aug. 20, 2019

(87) PCT Pub. No.: WO2020/007045
PCT Pub. Date: Jan. 9, 2020

(65) Prior Publication Data
US 2020/0174050 A1 Jun. 4, 2020

(30) Foreign Application Priority Data
Jul. 2, 2018 (CN) .......................... 201810710416.0

(51) Int. Cl.
*G01R 27/26* (2006.01)
*H01P 1/18* (2006.01)
(52) U.S. Cl.
CPC .......... *G01R 27/2623* (2013.01); *H01P 1/184* (2013.01)
(58) Field of Classification Search
CPC .... G01R 27/2623; H01P 1/184; H01Q 9/0407
See application file for complete search history.

(56) References Cited

U.S. PATENT DOCUMENTS

| 8,013,688 B2 * | 9/2011 | White | H01P 5/10 333/134 |
| 2009/0073332 A1 * | 3/2009 | Irie | H01Q 9/0485 349/20 |

(Continued)

FOREIGN PATENT DOCUMENTS

| CN | 2062457 U | 9/1990 |
| CN | 103901278 A | 7/2014 |

(Continued)

OTHER PUBLICATIONS

First Office Action, including Search Report, for Chinese Patent Application No. 201810710416.0, dated Apr. 24, 2019, 17 pages.

(Continued)

*Primary Examiner* — Jeff W Natalini
(74) *Attorney, Agent, or Firm* — Westman, Champlin & Koehler, P.A.

(57) ABSTRACT

The present disclosure provides a measuring device, a measurement system, and a measuring method for a dielectric constant of a liquid crystal. The measuring device includes: a first substrate and a second substrate opposite to each other; a conductive layer disposed on a side of the first substrate facing the second substrate, wherein the conductive layer is configured to receive a first voltage signal; a resonant structure layer disposed on a side of the second substrate facing the first substrate, the resonant structure layer being configured to receive a second voltage signal and configured to transmit the microwave signal; a frame disposed between the first substrate and the second substrate, the frame cooperating with the first substrate and the second substrate to form a cavity for accommodating the liquid crystal to be measured.

18 Claims, 7 Drawing Sheets

(56) References Cited

U.S. PATENT DOCUMENTS

| | | | | |
|---|---|---|---|---|
| 2009/0278744 | A1* | 11/2009 | Kirino | H01Q 9/045 343/700 MS |
| 2012/0261615 | A1* | 10/2012 | Manabe | C07C 15/14 252/299.66 |
| 2015/0380789 | A1* | 12/2015 | Jakoby | H01P 1/184 343/905 |

FOREIGN PATENT DOCUMENTS

| | | | |
|---|---|---|---|
| CN | 107462774 | A | 12/2017 |
| CN | 107490727 | A | 12/2017 |
| CN | 108490270 | A | 9/2018 |
| JP | 2016153751 | A | 8/2016 |

OTHER PUBLICATIONS

Ge Yi et al., "Techniques for the Measurement of Permittivity of Liquid Crystals at Millimeter-wave to Terahertz Frequencies," doi: 10. 16180/j. cnki. issn1007-7820, www. dianzikeji. org, dated Apr. 30, 2017, 5 pages.

\* cited by examiner

MEASURING DEVICE, MEASURING SYSTEM, AND MEASURING METHOD FOR LIQUID CRYSTAL DIELECTRIC CONSTANT

CROSS-REFERENCE TO RELATED APPLICATION

This application is a Section 371 National Stage application of International Application No. PCT/CN2019/074449, filed on 1 Feb. 2019, which has not yet published, and claims priority to Chinese Patent Application No. 201810710416.0, entitled "measuring device, measuring system and measuring method for a dielectric constant of a liquid crystal" and filed on Jul. 2, 2018, the disclosures of which are incorporated herein by reference.

TECHNICAL FIELD

Embodiments of the present disclosure relate to technical field of liquid crystal device, and particularly to a measuring device, a measuring system, and a measuring method for a dielectric constant of a liquid crystal.

DESCRIPTION OF RELATED ART

Accurate measurement of a dielectric constant of liquid crystal material at the microwave frequency band is the key to the design and analysis of liquid crystal microwave devices. In the existing methods for measuring the dielectric constant of liquid crystal material at a microwave frequency band, for example, a perturbation method obtains a relatively good measurement accuracy, but a measuring device for the method involves a complicated structure and a high cost; and, as another example, a phase shifter method needs a measuring device with a relative simply structure compared with that for the perturbation method, but requires high precision during processing structural members while needing to apply a bias magnetic field to liquid crystal material in combination with a strong static magnetic field, so finally still involves problem of complex structure and high cost.

SUMMARY

Embodiments of the present disclosure provide a measuring device, a measurement system, and a measuring method for a dielectric constant of a liquid crystal, which may provide a measuring device for a dielectric constant of a liquid crystal at microwave frequency band having a simplified structure, reduced cost and increased sensitivity and accuracy.

As an aspect, embodiments of the present disclosure provide a measuring device for a dielectric constant of a liquid crystal, including: a first substrate and a second substrate opposite to each other; a conductive layer on a side of the first substrate facing the second substrate, the conductive layer being configured to receive a first voltage signal; and a resonant structure layer on a side of the second substrate facing the first substrate, the resonant structure layer being configured to receive a second voltage signal and configured to transmit a microwave signal; wherein a cavity for accommodating the liquid crystal to be measured is defined between the first substrate and the second substrate.

In an embodiment, the measuring device further comprises a first alignment film located on a side of the conductive layer facing the second substrate; and a second alignment film located on a side of the resonant structure layer facing the first substrate.

In an embodiment, the resonant structure layer comprises: a microwave signal input end for receiving a microwave signal and a microwave signal output end for outputting a microwave signal, the resonant structure layer being configured to enable the microwave signal inputted by the microwave signal input end to be coupled to the resonant structure in the resonant structure layer to generate resonance.

In an embodiment, the resonant structure layer comprises: a composite resonant structure comprising a primary resonant structure and a secondary resonant structure spaced apart from each other, a quality factor of the primary resonant structure being less than a quality factor of the secondary resonant structure, wherein the microwave signal input end and the microwave signal output end are respectively disposed at two ends of the primary resonant structure, and the microwave signal input end is provided with a first signal line for receiving the microwave signal, and the microwave signal output end is provided with a second signal line for outputting the microwave signal; and a first coupling capacitor connected between the first signal line and the primary resonant structure, and a second coupling capacitor connected between the second signal line and the primary resonant structure.

In an embodiment, the primary resonant structure comprises a linear metal strip, one end of the linear metal strip being electrically connected to the first coupling capacitor and the other end thereof being electrically connected to the second coupling capacitor.

In an embodiment, the primary resonant structure further comprises a first linear additional metal strip and a second linear additional metal strip, the first linear additional metal strip and the second linear additional metal strip being respectively located at opposite ends of the linear metal strip and perpendicular to the linear metal strip, the first linear additional metal strip being used as one electrode of the first coupling capacitor, the second linear additional metal strip is used as one electrode of the second coupling capacitor.

In an embodiment, the secondary resonant structure comprises a spiral metal strip.

In an embodiment, a vertical bisector of the primary resonant structure passes through a geometric center of the secondary resonant structure.

In an embodiment, a minimum spacing between the primary resonant structure and the secondary resonant structure is less than or equal to $0.3\lambda$; wherein $\lambda$ is a working wavelength of the microwave inputted to the measuring device.

In an embodiment, the first coupling capacitance comprises two first metal electrodes opposing to and spaced apart from each other, wherein one of the first metal electrodes is electrically coupled to one end of the primary resonant structure, and the other of the first metal electrodes is electrically connected to the first signal line; and the second coupling capacitor includes two second metal electrodes opposite to and spaced from each other, wherein one of the second metal electrodes is electrically connected to the other end of the primary resonant structure, and the other of the second metal electrodes is electrically connected to the second signal line.

In an embodiment, the first metal electrodes and the second metal electrodes are both linear metal strips; or the first metal electrodes and the second metal electrodes are both interdigital metal electrodes.

In an embodiment, a region of the first substrate occupied by the cavity covers at least an orthographic projection of the secondary resonant structure on the first substrate.

In an embodiment, the first alignment film and the second alignment film are configured to be in direct contact with and align the liquid crystal to be measured, and the first alignment film and the second alignment film have the same alignment direction.

In an embodiment, the conductive layer is grounded.

In an embodiment, the measuring device further comprises a frame disposed between the first substrate and the second substrate, the frame together with the first substrate and the second substrate defines the cavity.

In an embodiment, the frame is made of a sealant, and the frame comprises a liquid crystal injection port for injecting the liquid crystal to be measured into the cavity.

As another aspect, embodiments of the present disclosure provide a method of measuring a dielectric constant of a liquid crystal, wherein the method include: injecting a liquid crystal to be measured into a cavity of a measuring device, applying a first voltage signal to a conductive layer of the measuring device, and applying a second voltage signal to a resonant structure layer of the measuring device; wherein the measuring device is the measuring device as mentioned above; inputting a microwave into the resonant structure layer of the measuring device; making a voltage difference between the first voltage signal and the second voltage signal be zero, and receiving the microwave outputted by the resonant structure layer to obtain a first transmission coefficient curve; making the voltage difference between the first voltage signal and the second voltage signal be greater than or equal to a saturation voltage value of the liquid crystal to be measured, and receiving the microwave outputted by the resonant structure layer to obtain a second transmission coefficient curve; and based on the first transmission coefficient curve, determining a dielectric constant of the liquid crystal corresponding thereto and considering it as a dielectric constant of the liquid crystal in a short axis direction, and based on the second transmission coefficient curve, determining a dielectric constant of the liquid crystal corresponding thereto and considering it as a dielectric constant of the liquid crystal in a long axis direction.

In an embodiment, the dielectric constant of the liquid crystal in the short axis direction and the dielectric constant of the liquid crystal in the long axis direction are found by using a simulation method, comprising: establishing a simulation model according to a corresponding measurement experiment model for obtaining the first transmission coefficient curve and the second transmission coefficient curve; making the voltage difference between the first voltage signal and the second voltage signal in the simulation model to zero and adjusting the dielectric constant of the liquid crystal in the short axis direction in the simulation model, so that an obtained simulation result coincides with the first transmission coefficient curve, and correspondingly the dielectric constant of the liquid crystal in the short axis direction is the dielectric constant of the liquid crystal to be measured in the short axis direction; and making the voltage difference between the first voltage signal and the second voltage signal in the simulation model be greater than or equal to the saturation voltage value of the liquid crystal to be measured and adjusting the dielectric constant of the liquid crystal in the long axis direction in the simulation model, so that the obtained simulation result coincides with the second transmission coefficient curve, and correspondingly the dielectric constant of the liquid crystal in the long axis direction is the dielectric constant of the liquid crystal to be measured in the long axis direction.

As an aspect, embodiments of the present disclosure provide a measurement system for a dielectric constant of a liquid crystal, wherein the measurement system comprises: the above mentioned the measuring device for a dielectric constant of a liquid crystal; a power supply device comprising a first voltage supply port and a second voltage supply port, the first voltage supply port being electrically connected to the conductive layer of the measuring device, the second voltage supply port being electrically connected to the resonant structure layer of the measuring device, the first voltage signal provided by the first voltage port and/or the second voltage signal provided by the second voltage port being adjustable; a microwave source connected to a microwave signal input end of the resonant structure layer; a vector network analyzer comprising an input port and an output port, the input port being coupled to the microwave signal input end of the resonant structure layer, the output port being coupled to a microwave signal output end of the resonant structure layer, the vector network analyzer being configured to generate a first transmission coefficient curve in situation where the voltage difference between the first voltage signal and the second voltage signal is zero, and a second transmission coefficient curve in situation where the voltage difference between the first voltage signal and the second voltage signal is greater than or equal to the saturation voltage value of the liquid crystal to be measured.

In an embodiment, the measurement system further comprises a processor coupled to the vector network analyzer and configured to calculate the dielectric constant of the liquid crystal in a short axis direction corresponding to the first transmission coefficient curve and the dielectric constant of the liquid crystal in a long axis direction corresponding to the second transmission coefficient curve.

BRIEF DESCRIPTION OF THE DRAWINGS

In order to more clearly illustrate embodiments of the present disclosure or the technical solutions in the prior art, the drawings to be used in the embodiments or the description of the prior art will be briefly described below. Obviously, the drawings in the following description are only some of the embodiments of the present disclosure, and other drawings may be obtained by those skilled in the art without inventive labor based on the drawings.

DETAILED DESCRIPTION

In order to make the objects, features and advantages of the present disclosure be more clearly understood, technical schemes of the embodiments of the present disclosure will be described clearly and completely in conjunction with the drawings. It is apparent that the described embodiments are only a part of the embodiments of the present disclosure, and not all of them. All other embodiments obtained by a person of ordinary skill in the art without inventive labor based on the embodiments of the present disclosure are fallen within the scope of the disclosure.

It should be noted that, in the embodiments of the present disclosure, a plane in which a liquid crystal dielectric constant measuring device 100 is located (which may also be regarded as the plane where a first substrate 1 or a second substrate 2 is located) is an XOY plane, and in the XOY plane, the X direction and the Y direction are two directions perpendicular to each other; a direction perpendicular to the XOY plane and directed from the first substrate 1 to the second substrate 2 is a Z direction.

Figure 1:
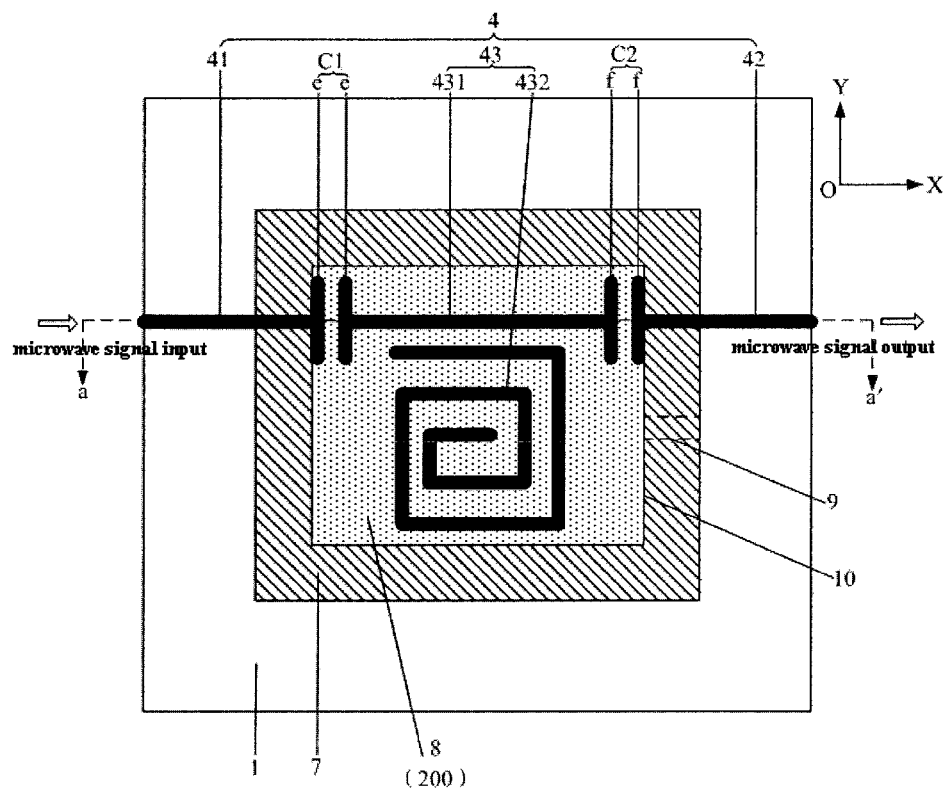
FIG. 1 is a plan structural view of a measuring device according to an embodiment of the present disclosure.
Figure 2:
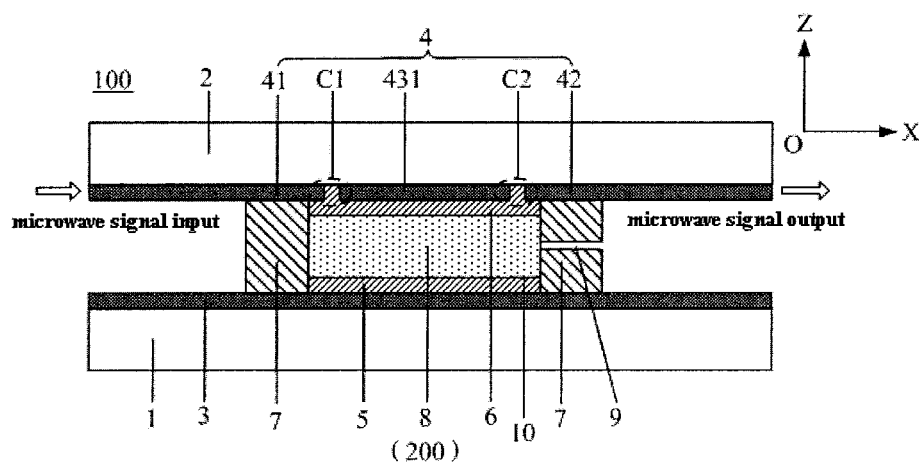
FIG. 2 is a sectional structural view of the measuring device shown in FIG. 1 along a broken line aa'.

The embodiments of the present disclosure provide a measuring device for a liquid crystal dielectric constant. As shown in FIG. 1 and FIG. 2, the measuring device 100 includes: a first substrate 1 and a second substrate 2 opposite to each other; a conductive layer 3 and a first alignment film 5 sequentially disposed on a side of the first substrate 1 facing the second substrate 2, the first alignment film 5 being located on a side of the conductive layer 3 facing the second substrate; and a resonant structure layer 4 and a second alignment film 6 on a side of the second substrate 2 facing the first substrate 1, the second alignment film 6 being located on a side of the resonant structure layer 4 facing the first substrate 1. In the present embodiment, the first substrate 1 and the second substrate 2 are disposed to provide a cavity 10 for accommodating liquid crystal to be measured therebetween.

In an embodiment, the measuring device may not include the first alignment film 5 and the second alignment film 6. In the present embodiment, as shown in FIGS. 1 and 2, the measuring device 100 includes: a first substrate 1 and a second substrate 2 opposite to each other; and a conductive layer 3 disposed on a side of the first substrate 1 facing the second substrate 2; and a resonant structure layer 4 on a side of the second substrate 2 facing the first substrate 1. The first substrate 1 and the second substrate 2 are configured to provide a cavity 10 therebetween for accommodating liquid crystal to be measured. The measuring device according to the present embodiment, when a microwave signal is inputted, can achieve functions similar to the measuring device including the first alignment film and the second alignment film 6, and, however, the structure of the present embodiment is relatively simplified.

In another embodiment, a frame 7 may be provided between the first substrate 1 and the second substrate 2, so as to, cooperating with the first substrate 1 and the second substrate 2, define a cavity 10 for accommodating the liquid crystal 200 to be measured. The frame 7 functions to prevent the liquid crystal 200 from leaking and to maintain a gap between the first substrate 1 and the second substrate 2 so as to provide a support for the space of the liquid crystal 200 between the first substrate 1 and the second substrate 2. In the above measuring device 100, the conductive layer 3 is configured to receive a first voltage signal, and the resonant structure layer 4 is configured to receive a second voltage signal, the first voltage signal and/or the second voltage signal being adjustable such that a voltage difference between the first voltage signal and the second voltage signal is adjustable.

The conductive layer is disposed on the first substrate, the resonant structure layer is disposed on the second substrate, and a voltage difference between the conductive layer and the resonant structure layer is adjustable. When the measuring device is used to measure the dielectric constant of the liquid crystal at a microwave frequency band, a microwave is inputted into the measuring device, and the microwave can couple with the resonant structure of the resonant structure layer in the measuring device generating resonance. Meanwhile, the voltage difference between the conductive layer and the resonant structure layer is adjusted such that an equivalent dielectric constant of the liquid crystal layer is changed. As different equivalent dielectric constants of the liquid crystal layer have different effects on the resonance in the resonant structure layer, and the effects may be reflected by a transmission coefficient curve for the microwave outputted by the measuring device. By obtaining the transmission coefficient curves at two limit states of the liquid crystal including at a horizontal orientation and at a vertical orientation, the dielectric constant in the short-axis direction and the dielectric constant in the long-axis direction of the liquid crystal can be derived according to the transmission coefficient curves, thereby realizing measurement of the dielectric constant of the liquid crystal at the microwave band.

The resonant structure layer 4 is configured to transmit microwave signals. In an embodiment, the resonant structure layer 4 has a microwave signal input end for receiving a microwave signal and a microwave signal output end for outputting a microwave signal.

When the dielectric constant of the liquid crystal at the microwave frequency band is measured using the above measuring device 100, the liquid crystal 200 to be measured is injected into the cavity 10 between the first substrate 1 and the second substrate 2 of the measuring device 100 to form a liquid crystal layer 8. After the liquid crystal 200 is injected, the first alignment film 5 on the first substrate 1 and the second alignment film 6 on the second substrate 2 are in direct contact with the liquid crystal 200 to align orientation of the liquid crystal 200. Exemplarily, the first alignment film 5 and the second alignment film 6 make an initial orientation of the liquid crystal 200 (i.e., the orientation of the liquid crystal 200 when no voltage is applied) be parallel to the XOY plane, such as be parallel to the positive and negative directions of the X axis, or be parallel to the positive and negative directions of the Y axis, or be parallel to a direction other than the positive and negative directions of the X axis and the positive and negative directions of the Y axis in the XOY plane. The measurement can be started after the liquid crystal 200 is injected.

During the measurement, a microwave signal is inputted into the measuring device 100 from a microwave signal input end of the resonant structure layer 4, and couples with the resonant structure in the resonant structure layer 4 to generate resonance. At the same time, a voltage difference between the conductive layer 3 and the resonant structure layer 4 is adjusted, that is, the voltage difference between the first voltage signal and the second voltage signal is adjusted to change the equivalent dielectric constant of the liquid crystal layer 8. According to the embodiment, different equivalent dielectric constants of the liquid crystal layer 8 have different effects on the resonance in the resonant structure layer 4, and the effects can be reflected by the transmission coefficient curve of the microwave outputted from the microwave signal output end of the resonant structure layer 4.

Thus, when the voltage difference between the first voltage signal and the second voltage signal is zero, the liquid crystal 200 is oriented along the XOY plane without any deflection, and a corresponding transmission coefficient curve can be obtained under an incident microwave signal whose polarization direction is parallel to the short axis of the liquid crystal 200. Then, based on the transmission coefficient curve, the dielectric constant of the liquid crystal 200 in the short axis direction can be obtained. Under similar principle, when the voltage difference between the first voltage signal and the second voltage signal is greater than or equal to the saturation voltage value of the liquid crystal 200, the liquid crystal 200 is oriented in the positive or negative direction of the Z axis, and a corresponding transmission coefficient curve can be obtained under an incident microwave signal whose polarization direction is parallel to the long axis of the liquid crystal 200. Then, based on the transmission coefficient curve, the dielectric constant of the liquid crystal 200 in the long axis direction can be obtained. Thereby, the measurement of the dielectric constant of the liquid crystal at the microwave frequency band is achieved.

Through simulation, it is found that when the dielectric constant of the liquid crystal 200 is measured by the above measuring device 100, even if the equivalent dielectric constant of the liquid crystal layer 8 is only slightly changed, a point, corresponding to the minimum value, of the transmission coefficient curve is significantly deviated. This means that the test device 100 has an extremely high sensitivity and enables accurate measurement. Moreover, compared with the existing measuring device, the measuring device 100 in the present disclosure does not require a magnetic field biasing mechanism, thus has a small size; the structure of the measuring device 100 in the present disclosure is relatively simple, and can be manufactured using a standardized semiconductor process, for example, a conductive layer is formed on a surface of the second substrate 2 facing the first substrate 1 and the resonant structure layer 4 may be formed by etching; it is not necessary to perform precise assembly of the components in the later stage, thereby achieving a low cost.

In the above measuring device 100, the resonant structure layer 4 may be formed in various structural designs, which are required such that an input microwave signal can be coupled to the resonant structure layer 4 to generate resonance. Further, the resonant structure layer provided by the embodiments of the present disclosure can further improve the sensitivity and accuracy of the measurement, and some possible designs are exemplified below.

In an embodiment, the resonant structure layer 4 includes: a composite resonant structure including a primary resonant structure and a secondary resonant structure spaced apart from each other, a quality factor of the primary resonant structure being less than a quality factor of the secondary resonant structure, wherein the microwave signal input end and the microwave signal output end are respectively disposed at two ends of the primary resonant structure, and the microwave signal input end is provided with a first signal line for receiving the microwave signal, and the microwave signal output end is provided with a second signal for outputting the microwave signal; and a first coupling capacitor connected between the first signal line and the primary resonant structure and a second coupling capacitor connected between the second signal line and the primary resonant structure. The primary resonant structure further includes a first linear additional metal strip and a second linear additional metal strip, wherein the first linear additional metal strip and the second linear additional metal strip are respectively located at two ends of the linear metal strip and are perpendicular to the linear metal strip, and the first linear additional metal strip is used as one electrode of the first coupling capacitor, and the second linear additional metal strip is used as one electrode of the second coupling capacitor.

FIG. 1 shows an embodiment. Referring to FIG. 1, the resonant structure layer 4 includes a composite resonant structure 43, a first signal line 41, a second signal line, a first coupling capacitor C1, and a second coupling capacitor C2. In the embodiment, the composite resonance structure 43 includes a primary resonant structure 431 and a secondary resonant structure 432 which are spaced apart from each other, and a quality factor of the primary resonant structure 431 is smaller than a quality factor of the secondary resonance structure 432. The resonant structure layer 4 of the present embodiment is provided to obtain a final transmission coefficient curve, which is steeper and thus is advantageous for enhancing the sensitivity and accuracy of the measurement.

The first signal line 41 and the second signal line 42 are respectively disposed at two ends of the primary resonant structure 431. The first signal line 41 serves as a microwave signal input end of the resonant structure layer 4, that is to say the microwave signal input end of the measuring device 100, for receiving microwave signals. The second signal line 42 serves as a microwave signal output end of the resonant structure layer 4, that is, the microwave signal output end of the measuring device 100, for outputting a microwave signal.

The first coupling capacitor C1 is electrically connected between the first signal line 41 and the primary resonant structure 431, and the second coupling capacitor C2 is electrically connected between the second signal line 42 and the primary resonant structure 431. When a microwave signal is inputted, the microwave signal is coupled at the first coupling capacitor C1 and the second coupling capacitor C2. The coupling effect at the first coupling capacitor C1 and the second coupling capacitor C2 excites the primary resonant structure 431 to generate a resonance, and the resonance induces the secondary resonant structure 432 and a resonance induced by the secondary resonant structure 432 will, in turn, affect the primary resonant structure 431, thereby resulting in a resonance with a very high quality factor and improving the accuracy and sensitivity of the measuring device 100.

In an embodiment, the primary resonant structure 431 includes a linear metal strip, one end of which is electrically connected to the first coupling capacitor C1 and the other end of which is electrically connected to the second coupling capacitor C2. The secondary resonant structure 432 includes a spiral metal strip such that the quality factor of the secondary resonant structure 432 is greater than the quality factor of the primary resonant structure 431.

Further, a vertical bisector of the primary resonant structure 431 passes through the center, such as a geometric center, of the secondary resonant structure 432 such that the composite resonant structure 43 formed by the primary resonant structure 431 and the secondary resonant structure 432 has an axisymmetric structure, which is advantageous for enhancing resonance and improving the quality factor.

In an embodiment, the first coupling capacitor C1 includes two first metal electrodes c which are opposite to and spaced apart from each other, wherein one of the first metal electrodes e is electrically connected to one end (left end) of the primary resonant structure 431, and the other of the first metal electrodes e is electrically connected to the first signal line 41. The second coupling capacitor C2 includes two second metal electrodes f which are opposite to and spaced apart from each other, wherein one of the second metal electrodes f is electrically connected to the other end (right end) of the primary resonant structure 431, and the other of the second metal electrodes f is electrically connected to the second signal line 42.

Figure 4:
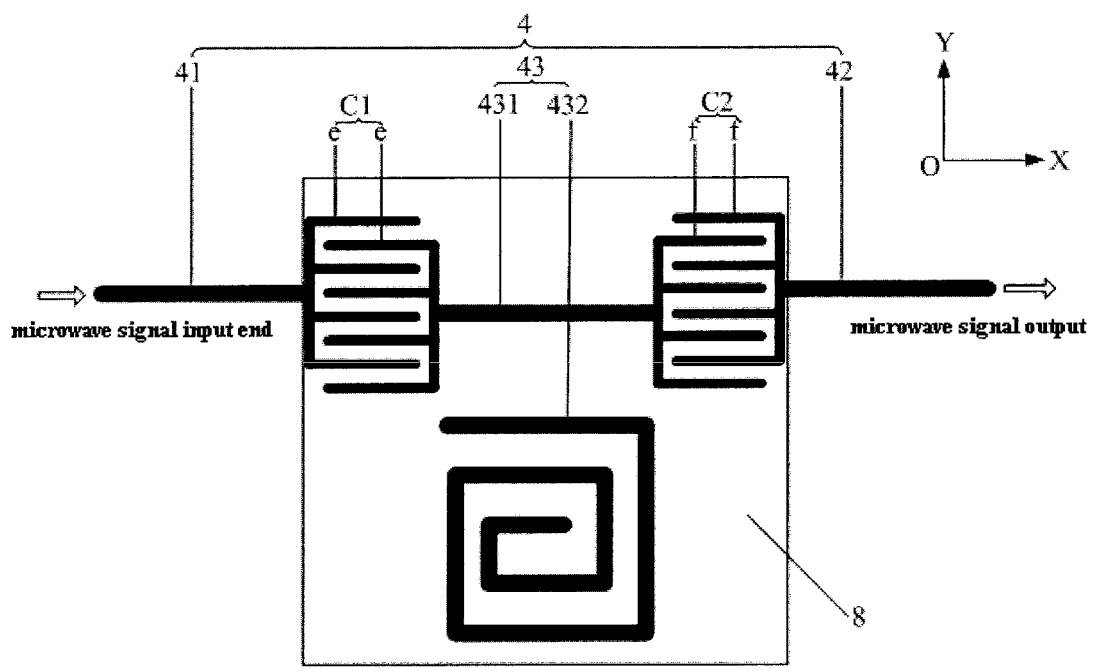
FIG. 4 is a plan view of a resonant structure layer in a measuring device according to another embodiment of the present disclosure.

In an embodiment, the first metal electrode e and the second metal electrode f may both be linear metal strips, as shown in FIG. 1. Alternatively, the first metal electrode e and the second metal electrode f may both be inter-digital metal electrodes, as shown in FIG. 4.

For design of the various dimensions of the resonant structure layer 4, the measuring devices 100 of different size specifications, operating frequency requirements and the like should have different size design schemes.

Figure 3:
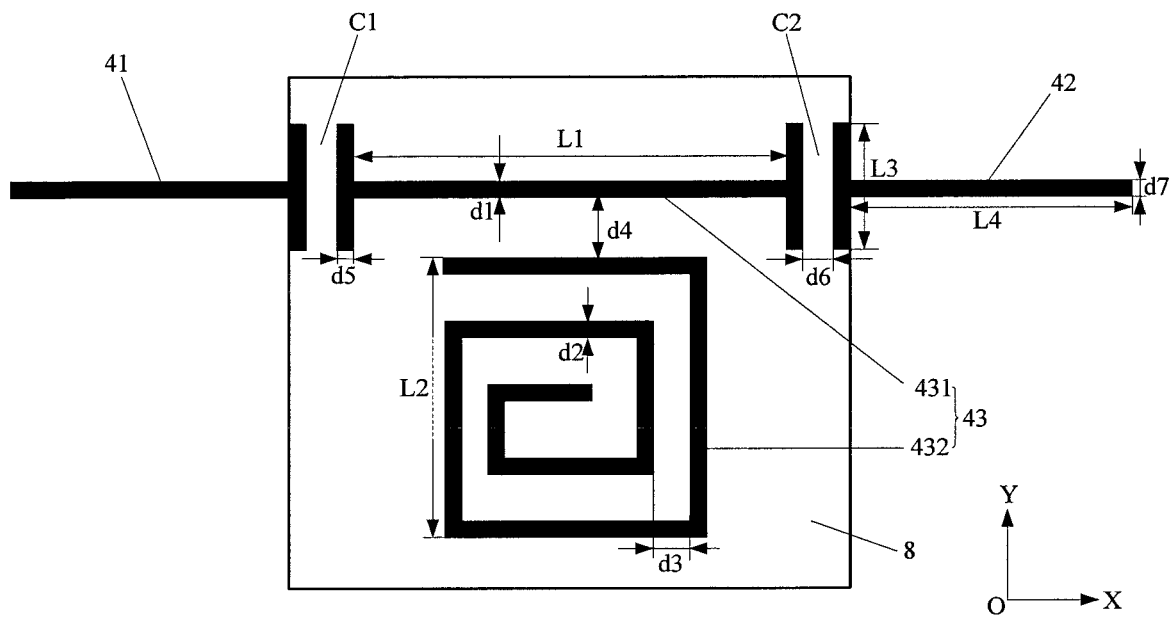
FIG. 3 is a plan view showing dimensions of the components of a resonant structure layer shown in FIG. 1.

Illustratively, taking the structure of the resonant structure layer 4 shown in FIG. 1 as an example, it is assumed that one set of sides of the liquid crystal layer 8 in the measuring device 100 are parallel to the X direction, and the other set of sides are parallel to the Y direction. The primary resonant structure 431 of the composite resonant structure 43 in the resonant structure layer 4 is parallel to the X direction, and the first metal electrode e of the first coupling capacitor C1 and the second metal electrode f of the second coupling capacitor C2 are both perpendicular to the primary resonant structure 431, that is, are both parallel to the Y axis. Referring to FIG. 3, each size parameter may be adopted as below (the following description is provided by assuming that the operating wavelength of the microwave inputted to the measuring device 100 is $\lambda$):

a length L1 of the primary resonant structure 431 is less than or equal to $0.7\lambda$, which may be selected to be about $0.5\lambda$, and a width d1 thereof is less than or equal to $0.5\lambda$;

an overall span L2 of the secondary resonant structure 432 is less than or equal to $5\lambda$, a width d2 thereof is less than or equal to $0.5\lambda$, a gap d3 in the spiral is less than or equal to $0.5\lambda$;

the minimum spacing d4 between the primary resonant structure 431 and the secondary resonant structure 432 is less than or equal to $0.3\lambda$;

as for the first coupling capacitor C1 and the second coupling capacitor C2, a length L3 of the metal electrodes is less than or equal to $0.5\lambda$, and a width d5 of the metal electrodes is less than or equal to $0.5\lambda$ and as for each coupling capacitor, a distance d6 between the two metal electrodes is less than or equal to $0.5\lambda$; and lengths L4 of the first metal signal line 41 and the second metal signal line 42 are less than or equal to $0.7\lambda$, and width d7 thereof is less than or equal to $0.5\lambda$.

In the embodiment, the conductive layer 3 and the resonant structure layer 4 are made of a conductive material. In an embodiment, they are both made of a metal, such as gold, silver, copper, aluminum, or the like. A wire for supplying the first voltage signal may be connected to any position on the conductive layer 3, and a wire for supplying the second voltage signal may be connected to any position on the resonant structure layer 4.

In an embodiment, thicknesses of the conductive layer 3 and the resonant structure layer 4 may range from 0.01 μm to 5 μm, optionally may be 1 μm.

A process of manufacturing the conductive layer 3 may include: forming a whole layer of conductive film by using a conductive layer material and performing processes such as evaporation, coating, printing or deposition on the conductive layer material. A process of manufacturing the resonant structure layer 4 may include: firstly, forming a whole layer of film having a designed thickness by using a resonant structure material, and then removing a specific portion of the formed film by a photolithography process such that a portion retained forms a desired pattern of the resonant structure layer.

The thickness of the cavity 10 formed between the first substrate 1 and the second substrate 2 can also be regarded as the thickness of the injected liquid crystal layer 8 and may be ranged from 0.1 mm to 50 mm, and optionally may be 1 mm.

In the embodiment, a region of the first substrate 1 occupied by the cavity 10 (which may correspond to an orthographic projection of the liquid crystal layer 8 on the first substrate 1) covers at least an orthographic projection of the secondary resonant structure 432 on the first substrate 1 so that the equivalent dielectric constant of the liquid crystal layer 8 can exert a relatively sufficient influence on the resonance effect on the composite resonance structure 43, thereby sufficiently affecting the microwaves transmitted in the composite resonance structure 43. In order to improve the sensitivity and accuracy of the measurement, the area of the first substrate 1 occupied by the cavity 10 may be appropriately enlarged to cover orthographic projections of the secondary resonant structure 432, the primary resonant structure 431, the first coupling capacitor C1 and the second coupling capacitor C2 on the first substrate 1, and may further even cover a portion of orthographic projection of the first signal line 41 and the second signal line 42 on the first substrate 1.

In some embodiments, the conductive layer 3 can be grounded, that is, the first voltage signal introduced by the conductive layer 3 is a ground voltage, so that the electrical potential at the conductive layer 3 can be fixed, and only a second voltage signal applied to the resonant structure layer 4 can be adjusted when the voltage difference between the conductive layer 3 and the resonant structure layer 4 are adjusted, thereby simplifying operation.

The thickness of the first substrate 1 and the second substrate 2 may range from 100 μm to 1000 μm, and optionally may be 160 μm. The dielectric constants of the first substrate 1 and the second substrate 2 may range from 1.1 to 20, and optionally may be 4.

The alignment directions of the first alignment film 5 and the second alignment film 6 are uniform such that the liquid crystal 200 to be measured has a uniform orientation after being injected into the cavity 10 of the measuring device 100. The alignment direction of the first alignment film 5 and the second alignment film 6, that is, the orientation of the liquid crystal 200 to be measured (the orientation described herein specifically refers to the orientation of the long axis of the liquid crystal molecules), may be aligned along the positive and negative directions of the X axis, or the positive and negative directions of the Y-axis, or any other directions in the XOY plane.

In an embodiment, the material of which the frame 7 is made may be a frame sealant. Referring again to FIG. 1 and FIG. 2, in some embodiments, a liquid crystal injection port 9 may be disposed in the frame 7. When a dielectric constant of liquid crystal is measured using the above measuring device 100, the liquid crystal 200 to be measured is firstly injected into the cavity 8 through the liquid crystal injection port 9, and then the dielectric constant measurement can be started. It should be noted that after the liquid crystal 200 is injected, the liquid crystal injection port 9 can be blocked by using a frame material (such as a sealant) to prevent the injected liquid crystal 200 from leaking during the measurement process. In some embodiments, the liquid crystal injection port 9 can be designed to be small, so that the liquid crystal will not be leaked without blocking the liquid crystal injection port 9 after the liquid crystal 200 is injected.

The above is a description of the structure of the measuring device 100 for a liquid crystal dielectric constant proposed in the present disclosure. Next, a measuring method for a dielectric constant of the liquid crystal at a microwave frequency band using the measuring device 100 for a liquid crystal dielectric constant will be described.

Figure 5:
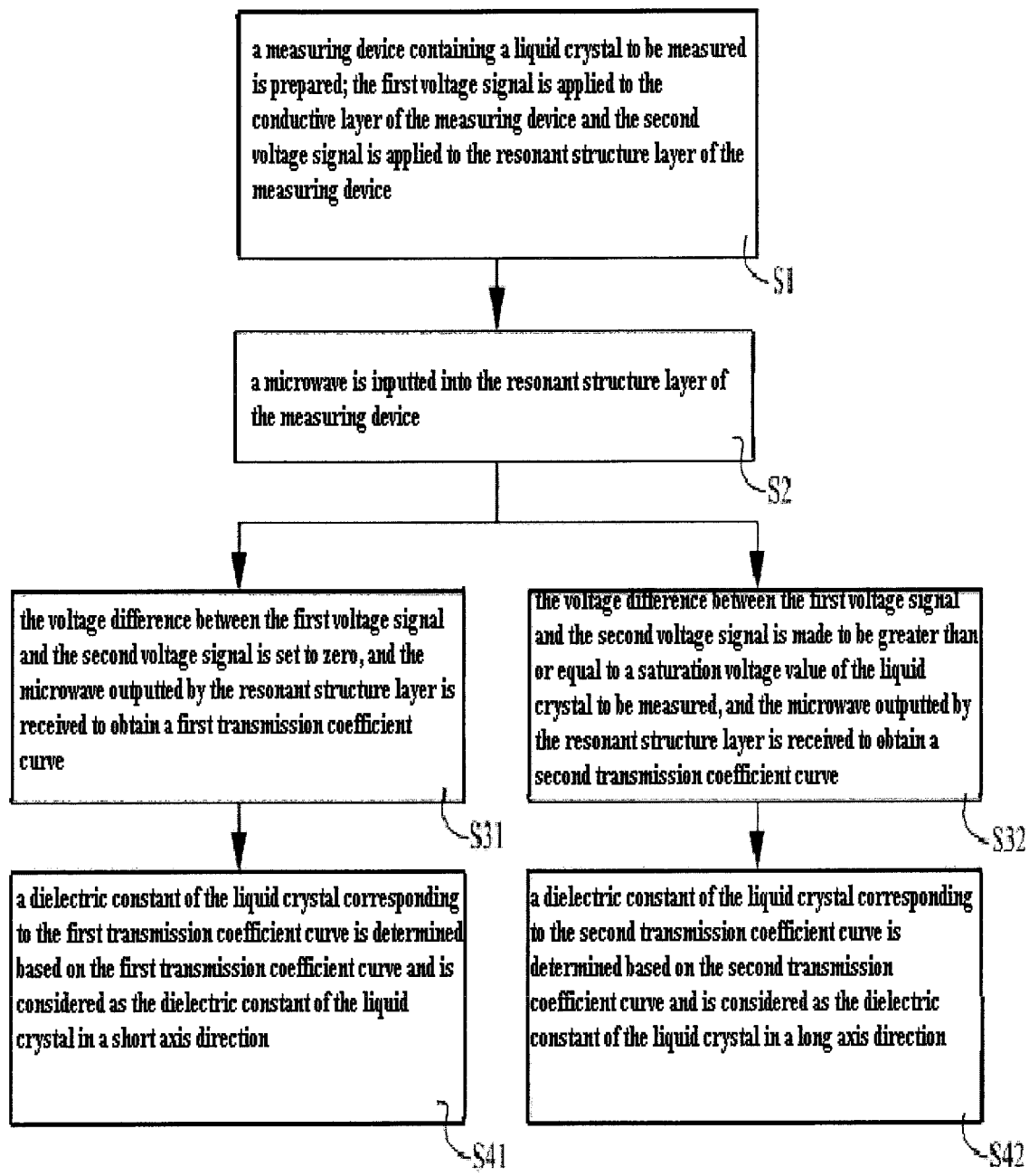
FIG. 5 is a basic flowchart of a measurement method provided by an embodiment of the present disclosure.

A method for measuring a dielectric constant of a liquid crystal according to an embodiment of the present disclosure will be described below with reference to FIG. 5, the method including the following steps:

in step S1, a measuring device containing a liquid crystal to be measured, which is the measuring device for a liquid crystal dielectric constant as described in the embodiments of the present disclosure, is prepared; the first voltage signal is applied to the conductive layer of the measuring device and the second voltage signal is applied to the resonant structure layer of the measuring device.

In the above step, the liquid crystal to be measured may be injected into the cavity of the measuring device, and then the wire for supplying the first voltage signal is electrically connected to the conductive layer, and the wire for providing the second voltage signal is electrically connected to the resonant structure layer, thereby completing the preparation work.

In step S2, a microwave is inputted into the resonant structure layer of the measuring device.

In the above step, specifically, a microwave source for providing the microwave is electrically connected to the microwave signal input end for receiving a microwave signal in the resonant structure layer.

In step S31, the voltage difference between the first voltage signal and the second voltage signal is set to zero, and the microwave outputted by the resonant structure layer is received to obtain a first transmission coefficient curve.

Figure 7:
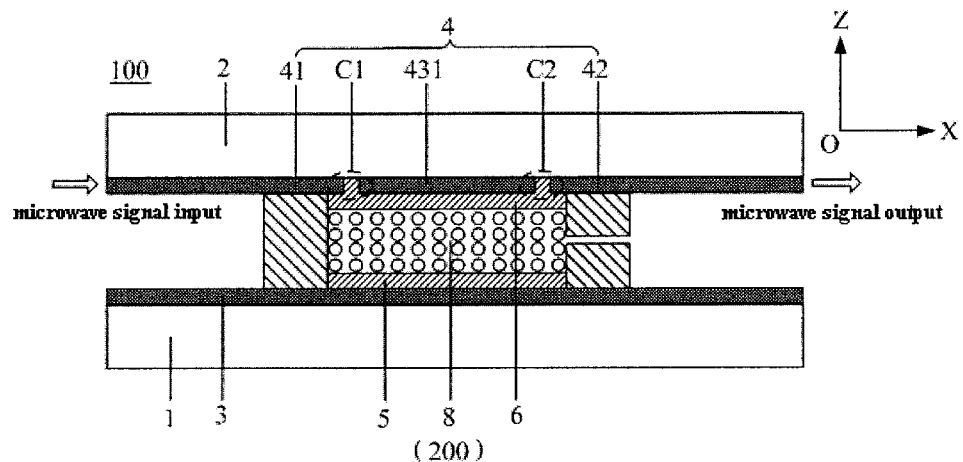
FIG. 7 is a schematic diagram of a measurement method according to an embodiment of the present disclosure.

In the above step, in order to make the voltage difference between the first voltage signal and the second voltage signal be zero, the voltages of the first voltage signal and the second voltage signal may be the same, or, the first voltage signal and the second voltage signal may not be inputted. By making the voltage difference between the first voltage signal and the second voltage signal be zero, the liquid crystal is maintained in a first extreme state: the deflection angle is zero, i.e., being maintained at the initial orientation. As shown in FIG. 7, the orientation of the liquid crystal 200 is parallel to the Y direction in this case assuming that the initial orientation of the liquid crystal 200 in the measuring device 100 (specifically, the orientation of the long axis when no voltage is applied or the voltage difference is zero) is parallel to the Y direction.

Further, in this step, the polarization direction of the inputted microwave signal should be made to be parallel to the short axis direction of the liquid crystal 200.

Figure 9:
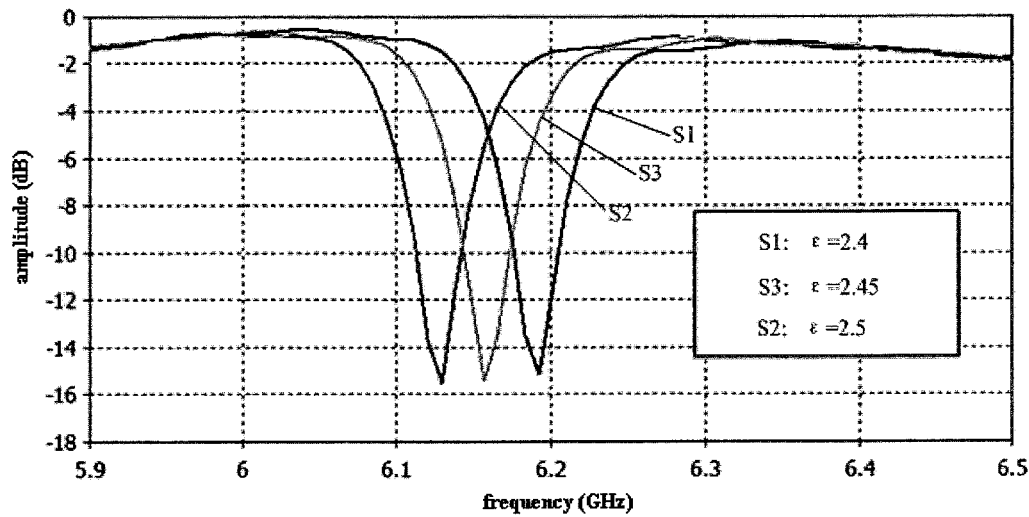
FIG. 9 is a graph showing a transmission coefficient obtained by a measurement method according to an embodiment of the present disclosure.

When the incident microwave is coupled with the resonant structure in the measuring device 100 to generate resonance, since the short axis direction of the liquid crystal 100 coincides with the polarization direction of the microwave, the dielectric constant of the liquid crystal 100 in the short axis direction affects the resonance. Referring to FIG. 9, assuming that the equivalent dielectric constant ε of the liquid crystal layer 8 is equal to 2.4 in this case, transmission wave of the microwave is received at the microwave signal output end of the resonant structure layer, and the first transmission coefficient curve S1 (i.e., the curve S21) is obtained. It can be seen from the first transmission coefficient curve S1 that it has a significant point corresponding to the minimum, which indicates that the resonance is strong and the quality factor is extremely high, and the measuring device 100 has extremely high precision.

In step S32, the voltage difference between the first voltage signal and the second voltage signal is made to be greater than or equal to a saturation voltage value of the liquid crystal to be measured, and the microwave outputted by the resonant structure layer is received to obtain a second transmission coefficient curve.

Figure 8:
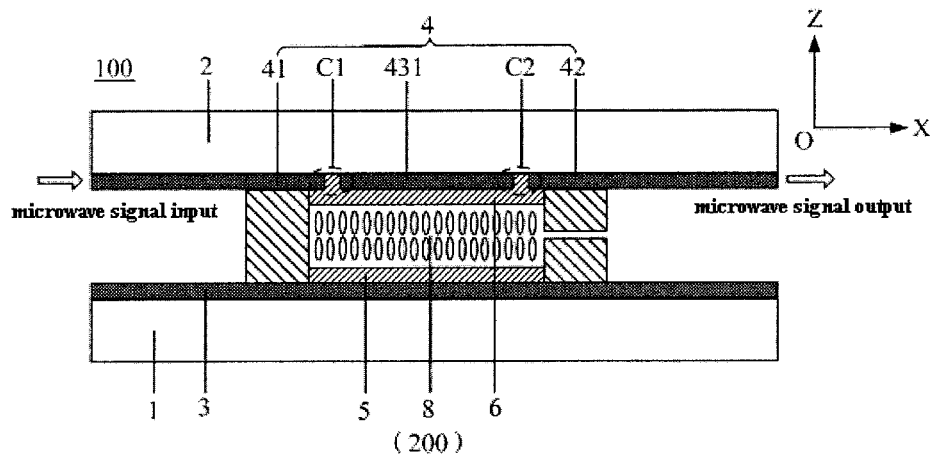
FIG. 8 is a schematic diagram of a measurement method according to another embodiment of the present disclosure.

In the above step, the voltage difference between the first voltage signal and the second voltage signal is the saturation voltage value of the liquid crystal to be measured, and both the voltages of the first voltage signal and the second voltage signal can be adjusted to achieve the foregoing objective; alternatively, one of the first and the second voltage signals is fixed, and the other is adjusted to achieve the foregoing objective; for example, the first voltage signal is fixed to be a ground voltage, and the second voltage signal is adjusted. By setting the voltage difference between the first voltage signal and the second voltage signal to the saturation voltage value of the liquid crystal to be measured, the liquid crystal is maintained to be in the second limit state: the deflection angle is 90 degrees, and the current orientation is perpendicular to the initial orientation. As shown in FIG. 8, assuming that the initial orientation of the liquid crystal 200 in the measuring device 100 is parallel to the Y direction, the orientation of the liquid crystal 200 in this state is perpendicular to the Y direction and parallel to the Z direction.

Further, in this step, the polarization direction of the inputted microwave signal should be made to be parallel to the long axis direction of the liquid crystal 200.

When the incident microwave is coupled with the resonant structure in the measuring device 100 to generate resonance, since the long axis direction of the liquid crystal 100 coincides with the polarization direction of the microwave, the dielectric constant of the liquid crystal 100 in the long axis direction affects the resonance. Referring to FIG. 9, assuming that the equivalent dielectric constant ε of the liquid crystal layer 8 is equal to 2.5 in this case, transmission wave of the microwave is received at the microwave signal output end of the resonant structure layer, and the second transmission coefficient curve S2 (i.e., the curve S21) is obtained. It can be seen from the second transmission coefficient curve S2 that it has a significant point corresponding to the minimum, which indicates that the resonance is strong and the quality factor is extremely high, and the measuring device 100 has extremely high precision.

It should be noted that, the above steps S31 and S32 are not limited to be performed in order, that is, step S31 may be performed first, and then step S32 may be performed; or step S32 may be performed first, and then step S31 may be performed.

In step S41, a dielectric constant of the liquid crystal corresponding to the first transmission coefficient curve is determined based on the first transmission coefficient curve and is considered as the dielectric constant of the liquid crystal in a short axis direction; a dielectric constant of the liquid crystal corresponding to the second transmission coefficient curve is determined based on the second transmission coefficient curve and is considered as the dielectric constant of the liquid crystal in a long axis direction. There are various methods for determining a corresponding liquid crystal dielectric constant based on the first or the second transmission coefficient curve. Embodiments of the present disclosure provide a simulation method, however, it should be understood that the present disclosure is not limited to only the simulation method.

Specifically, the dielectric constant of the liquid crystal corresponding to the first transmission coefficient curve S1 is found by a simulation method, and the dielectric constant is used as the dielectric constant $\varepsilon_\perp$ of the liquid crystal in the short axis direction.

Figure 6:
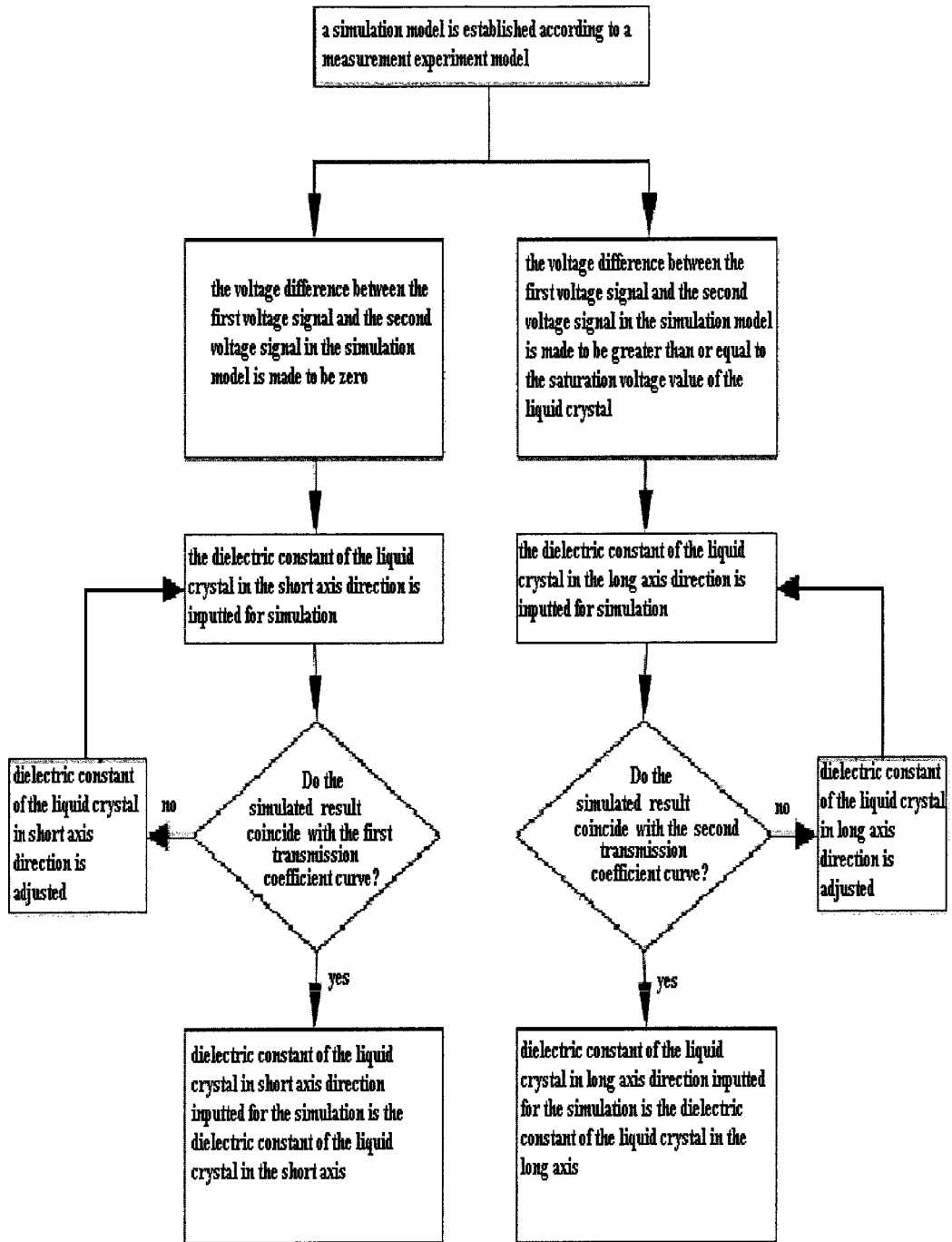
FIG. 6 is a specific flowchart of a step in a measurement method according to an embodiment of the present disclosure.

Referring to FIG. 6, in the above step S41, the dielectric constant $\varepsilon_\perp$ of the liquid crystal in the short axis direction is obtained by using a simulation method, which may specifically include the following processes:

First, a simulation model is established according to a measurement experiment model corresponding to the steps of obtaining the first transmission coefficient curve S1 and the second transmission coefficient curve S2. The so-called "measurement experimental model corresponding to the steps of obtaining the first transmission coefficient curve S1 and the second transmission coefficient curve S2" includes obtaining various parameters involved in performing measurement by the measuring device 100, including dimensions of various components and structures, etc., in the measuring device 100.

Exemplarily, in the "measurement experimental model corresponding to the steps of obtaining the first curve and the second curve", the thickness of the liquid crystal layer in the measuring device 100 is 1 mm; the thickness of the first substrate 1 and the second substrate 2 is 160 μm and the dielectric constant of them is 4; the thickness of the conductive layer 3 and the resonant structure layer 4 is 1 μm; the resonant structure in the resonant structure layer 4 adopts the structure shown in FIG. 1 and FIG. 3, and the dimensional parameters are as follows:

TABLE 1

| | | | | (unit: mm) | | | | | |
|---|---|---|---|---|---|---|---|---|---|
| L1 | L2 | L3 | L4 | d1 | d2 | d3 | d4 | d5 | d6 |
| 10 | 50 | 5 | 11.8 | 1 | 0.6 | 0.6 | 0.5 | 0.6 | 1 |

When establishing a simulation model, the above parameters are referred to.

Then, the voltage difference between the first voltage signal and the second voltage signal in the simulation model is made to be zero, and the dielectric constant $\varepsilon_\perp$ of the liquid crystal in the short axis direction in the simulation model is adjusted, so that the obtained simulation result coincides with the first transmission coefficient curve S1. In this case, the corresponding dielectric constant $\varepsilon_\perp$ of the liquid crystal in the short axis direction is the dielectric constant $\varepsilon_\perp$ of the liquid crystal to be measured in the short axis direction. Continuing to refer to FIG. 6, during the process, the initial dielectric constants of the liquid crystal in the long axis direction and the short axis direction are needed to be set firstly and inputted into the simulation model for simulation.

After the initial liquid crystal dielectric constants are inputted, through simulation, the corresponding transmission coefficient curve can be obtained, and the curve is compared with the first transmission coefficient curve S1 previously measured in step S31 to judge whether the two coincide with each other or not: if not, it reveals the set dielectric constant $\varepsilon_\perp$ of the liquid crystal in short axis direction is not suitable and it is adjusted, and the adjusted dielectric constant $\varepsilon_\perp$ of the liquid crystal in short axis direction is inputted into the simulation model for simulation again, and the above judgment and adjustment steps are repeated until the simulation curve matching the first transmission coefficient curve S1 is found, and the dielectric constant $\varepsilon_\perp$ of the liquid crystal in the short axis direction obtained by the simulation is the dielectric constant $\varepsilon_\perp$ of the liquid crystal in the short axis direction measured in the step S31; if the curve coincides with the first transmission coefficient curve S1 previously measured in step S31, it reveals the dielectric constant $\varepsilon_\perp$ of the liquid crystal in short axis direction obtained by the simulation is the dielectric constant $\varepsilon_\perp$ of the liquid crystal in the short axis direction measured in the step S31.

In step S42, the dielectric constant of the liquid crystal corresponding to the second transmission coefficient curve S2 is found by using the simulation method, and the dielectric constant is used as the dielectric constant $\varepsilon_\parallel$ of the liquid crystal in the short axis direction.

Referring to FIG. 6 and referring to the specific description of the above step S41, in the above step S42, the dielectric constant $\varepsilon_\parallel$ of the liquid crystal in the long axis direction is obtained by the simulation method, which may specifically include the following process: based on the previously established simulation model, the voltage difference between the first voltage signal and the second voltage signal in the simulation model is made to be greater than or equal to the saturation voltage value of the liquid crystal to be measured and the dielectric constant $\varepsilon_\parallel$ of the liquid crystal in the long axis direction in the simulation model is adjusted, so that the simulation result coincides with the second transmission coefficient curve S2, and the dielectric constant $\varepsilon_\parallel$ of the liquid crystal in the long axis direction obtained by the simulation is the dielectric constant $\varepsilon_\parallel$ of the liquid crystal to be measured in the long axis direction.

Continuing to refer to FIG. 6, in the process, the initially-set dielectric constants of the liquid crystal in the long axis direction and the short-axis direction are firstly inputted into the simulation model, and the corresponding transmission coefficient curve may be obtained after simulation; the curve is compared with the second transmission coefficient curve S2 previously obtained by measuring in the step S32 to judge whether or not the two coincide with each other: if not, it reveals that the set dielectric constant $\varepsilon_\parallel$ of the liquid crystal in the long axis direction is not suitable and it is adjusted, and the adjusted dielectric constant $\varepsilon_\parallel$ of the liquid crystal in long axis direction is inputted into the simulation model for simulation again, and the above judgment and adjustment steps are repeated until the simulation curve matching the second transmission coefficient curve S2 is found, and the dielectric constant $\varepsilon_\parallel$ of the liquid crystal in the long axis direction obtained by the simulation is the dielectric constant $\varepsilon_\parallel$ of the liquid crystal in the long axis direction measured in the step S32; if the curve coincides with the second transmission coefficient curve S2 previously measured in step S32, it reveals the dielectric constant $\varepsilon_\parallel$ of the liquid crystal in long axis direction obtained by the simulation is the dielectric constant $\varepsilon_\parallel$ of the liquid crystal in the long axis direction measured in the step S32.

It should be noted that, the above steps S41 and S42 are not limited to be performed in order, that is, step S41 may be first performed, then step S42 may be performed, or step S42 may be performed first, and then step S41 may be performed.

As already mentioned above, the measuring device 100 provided by the embodiments of the present disclosure is used for measuring the dielectric constant of the liquid crystal at the microwave frequency band with extremely high sensitivity. This conclusion can be verified by simulation.

Exemplarily, based on the simulation model corresponding to the curve shown in FIG. 9, that is, the simulation model established in the above step S41, the first transmission coefficient curve S1 can be obtained when the equivalent dielectric constant ε of the liquid crystal layer is equal to 2.4, the third transmission coefficient curve S3 can be obtained when the equivalent dielectric constant ε of the liquid crystal layer is equal to 2.45, and the second transmission coefficient curve S2 can be obtained when the equivalent dielectric constant ε of the liquid crystal layer is equal to 2.5. It can be clearly seen from the curve graph that even if the equivalent dielectric constant of the liquid crystal layer has only a very slight change (only a change value of 0.05), the point of the transmission coefficient curve corresponding to zero will be significantly shifted, which means that the measuring device 100 in the embodiment of the present disclosure has extremely high sensitivity.

Figure 10:
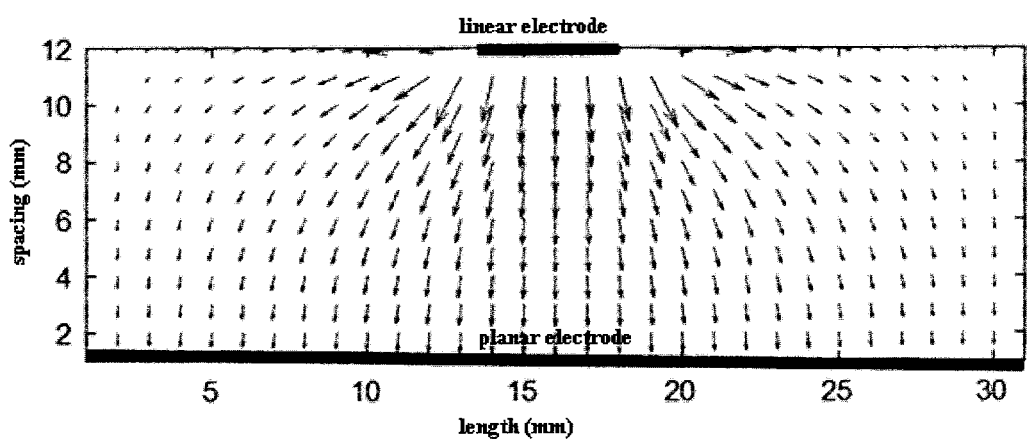
FIG. 10 is a view showing a distribution of orientations of liquid crystal molecules after a driving voltage is applied to a line electrode.

It should be noted that, in the embodiments of the present disclosure, although the electrode used for driving the liquid crystal is a linear electrode (i.e., the electrode in the resonant structure layer), effective driving of the liquid crystal can still be ensured. Referring to FIG. 10, liquid crystal molecules at the linear electrode and in a certain range surrounding the linear electrode can be effectively driven; in the application context in the embodiments of the present disclosure, it is not necessary to drive the liquid crystal in a large space range during measurement of the dielectric constant of the liquid crystal by the measuring device. Moreover, the transmission coefficient curves as shown in FIG. 9 are all obtained after changing only the equivalent dielectric constant of the liquid crystal layer directly under the linear electrode and a significant change of the resonance frequency (i.e., the point corresponding to the minimum) of the measuring device can be observed. It can be seen that the change of driving of the linear electrode can effectively change the equivalent dielectric constant of the liquid crystal layer, and the measuring device can also sense the change very sensitively. In summary, it is sufficient to use a linear electrode to drive the liquid crystal so as to change the equivalent dielectric constant of the liquid crystal layer.

In addition, the measurement method provided by the present disclosure is applicable to the measurement of the dielectric constant of nematic liquid crystal at the terahertz wave band.

Figure 11:
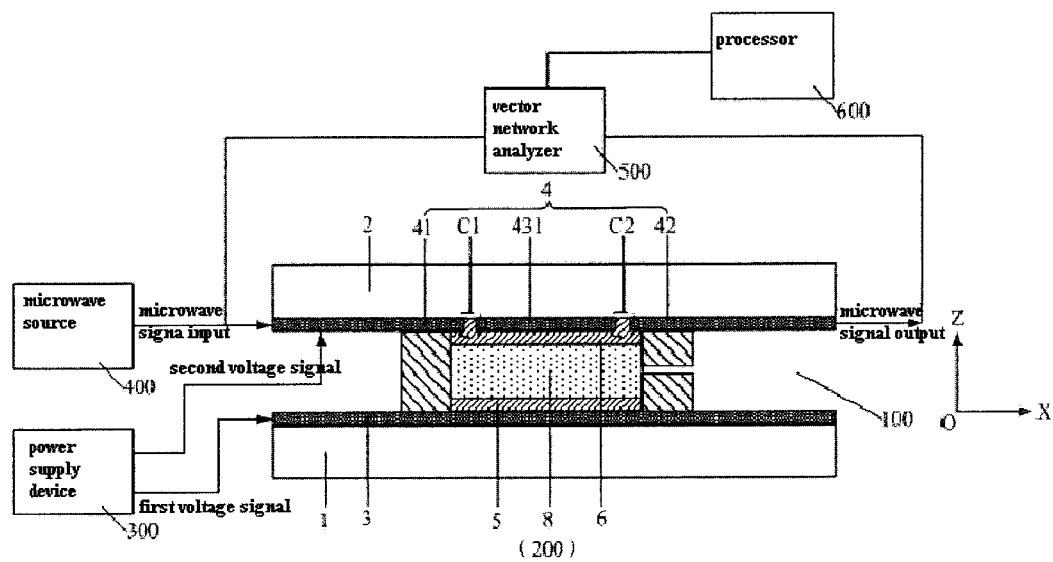
FIG. 11 is a schematic structural diagram of a measurement system according to an embodiment of the present disclosure.

Based on the above-mentioned measuring device and measurement method for a dielectric constant of liquid crystal, embodiments of the present disclosure provide a measurement system for a dielectric constant of a liquid crystal, as shown in FIG. 11, including: the measuring device 100 for a dielectric constant of a liquid crystal, power supply device 300, a microwave source 400, and a vector network analyzer 500.

In the embodiment, the measuring device 100 for a dielectric constant of a liquid crystal is that provided in the embodiments of the present disclosure, and has the advantages of high measurement sensitivity and precision, simple structure, and low cost.

The power supply device 300 includes a first voltage supply port and a second voltage supply port, the first voltage supply port is electrically connected to the conductive layer 3 of the measuring device, and the second voltage supply port is electrically connected to the resonant structure layer 4 of the measuring device. The first voltage signal provided by the first voltage supply port and/or the second voltage signal provided by the second voltage supply port are adjustable such that the voltage difference between the conductive layer 3 and the resonant structure layer 4 is adjustable so as to drive liquid crystal molecules in the liquid crystal layer 8 to deflect to different extent thereby changing the equivalent dielectric constant of the liquid crystal layer 8. As a possible design, the first voltage signal can be a ground signal.

The microwave source 400 is electrically connected to the microwave signal input end of the resonant structure layer 4 (i.e., the first signal line 41) for inputting the microwave signal, required for measurement, to the resonant structure layer 4.

The vector network analyzer 500 includes an input port and an output port, wherein the input port is electrically connected to the microwave signal input end of the resonant structure layer 4 (i.e., the first signal line 41), and the output port is electrically connected to the microwave signal output end of the resonant structure layer 4 (i.e., the second signal line 42). The vector network analyzer 500 is configured to generate the first transmission coefficient curve in situation where the voltage difference between the first voltage signal and the second voltage signal is zero, and to generate the second transmission coefficient curve in situation where the voltage difference between the first voltage signal and the second voltage signal is greater than or equal to the saturation voltage value of the liquid crystal to be measured.

Further, based on the above measurement system and continuedly with reference to FIG. 11, the measurement system may further include a processor 600 coupled to the vector network analyzer 500 and configured to perform steps S41 and S42 in the method of measuring a dielectric constant of a liquid crystal provided by the present disclosure, that is, the processor 600 is capable of performing simulation derivation to obtain the dielectric constant $\varepsilon_c$ of the liquid crystal in the short axis direction corresponding to the first transmission coefficient curve and the dielectric constant $\varepsilon_\parallel$ of the liquid crystal in the long axis direction corresponding to the second transmission coefficient curve.

The above description is only for the specific embodiments of the present disclosure, but the scope of the present disclosure is not limited thereto, and any change or replacement for the embodiments that can be easily conceived by those skilled in the art within the technical scope of the present disclosure should be covered within the scope of protection of the present disclosure. Therefore, the scope of protection of the present disclosure should be determined by the scope of the claims.

The invention claimed is:

1. A measuring device for a dielectric constant of a liquid crystal, wherein the measuring device comprises:
   a first substrate and a second substrate opposite to each other;
   a conductive layer on a side of the first substrate facing the second substrate, the conductive layer being configured to receive a first voltage signal; and
   a resonant structure layer on a side of the second substrate facing the first substrate, the resonant structure layer being configured to receive a second voltage signal and configured to transmit a microwave signal;

wherein a cavity for accommodating the liquid crystal to be measured is defined between the first substrate and the second substrate, wherein the resonant structure layer comprises: a microwave signal input end for receiving a microwave signal and a microwave signal output end for outputting a microwave signal, the resonant structure layer being configured to enable the microwave signal inputted by the microwave signal input end to be coupled to the resonant structure in the resonant structure layer to generate resonance, and wherein the resonant structure layer comprises: a composite resonant structure comprising a primary resonant structure and a secondary resonant structure spaced apart from each other, a quality factor of the primary resonant structure being less than a quality factor of the secondary resonant structure, wherein the microwave signal input end and the microwave signal output end are respectively disposed at two ends of the primary resonant structure, and the microwave signal input end is provided with a first signal line for receiving the microwave signal, and the microwave signal output end is provided with a second signal line for outputting the microwave signal; and a first coupling capacitor connected between the first signal line and the primary resonant structure, and a second coupling capacitor connected between the second signal line and the primary resonant structure.

2. The measuring device as claimed in claim 1, wherein the measuring device further comprises a first alignment film located on a side of the conductive layer facing the second substrate; and a second alignment film located on a side of the resonant structure layer facing the first substrate.

3. The measuring device as claimed in claim 2, wherein the first alignment film and the second alignment film are configured to be in direct contact with and align the liquid crystal to be measured, and the first alignment film and the second alignment film have the same alignment direction.

4. The measuring device as claimed in claim 1, wherein the primary resonant structure comprises a linear metal strip, one end of the linear metal strip being electrically connected to the first coupling capacitor and the other end thereof being electrically connected to the second coupling capacitor.

5. The measuring device as claimed in claim 4, wherein the primary resonant structure further comprises a first linear additional metal strip and a second linear additional metal strip, the first linear additional metal strip and the second linear additional metal strip being respectively located at opposite ends of the linear metal strip and perpendicular to the linear metal strip, the first linear additional metal strip being used as an electrode of the first coupling capacitor, the second linear additional metal strip is used as an electrode of the second coupling capacitor.

6. The measuring device as claimed in claim 1, wherein the secondary resonant structure comprises a spiral metal strip.

7. The measuring device as claimed in claim 6, wherein a vertical bisector of the primary resonant structure passes through a geometric center of the secondary resonant structure.

8. The measuring device as claimed in claim 6, wherein a minimum spacing between the primary resonant structure and the secondary resonant structure is less than or equal to $0.3\lambda$; wherein $\lambda$ is a working wavelength of the microwave inputted to the measuring device.

9. The measuring device as claimed in claim 1, wherein the first coupling capacitance comprises two first metal electrodes opposing to and spaced apart from each other, wherein one of the first metal electrodes is electrically coupled to one end of the primary resonant structure, and the other of the first metal electrodes is electrically connected to the first signal line; and the second coupling capacitor includes two second metal electrodes opposite to and spaced from each other, wherein one of the second metal electrodes is electrically connected to the other end of the primary resonant structure, and the other of the second metal electrodes is electrically connected to the second signal line.

10. The measuring device as claimed in claim 9, wherein the first metal electrodes and the second metal electrodes are both linear metal strips; or the first metal electrodes and the second metal electrodes are both interdigital metal electrodes.

11. The measuring device as claimed in claim 1, wherein a region of the first substrate occupied by the cavity covers at least an orthographic projection of the secondary resonant structure on the first substrate.

12. The measuring device as claimed in claim 1, wherein the conductive layer is grounded.

13. The measuring device as claimed in claim 1, wherein the measuring device further comprises a frame disposed between the first substrate and the second substrate, the frame together with the first substrate and the second substrate defines the cavity.

14. The measuring device as claimed in claim 13, wherein the frame is made of a sealant, and the frame comprises a liquid crystal injection port for injecting the liquid crystal to be measured into the cavity.

15. A method of measuring a dielectric constant of a liquid crystal, wherein the method comprises:

injecting a liquid crystal to be measured into a cavity of a measuring device, applying a first voltage signal to a conductive layer of the measuring device, and applying a second voltage signal to a resonant structure layer of the measuring device; wherein the measuring device is the measuring device as claimed in claim 1;

inputting a microwave into the resonant structure layer of the measuring device;

making a voltage difference between the first voltage signal and the second voltage signal be zero, and receiving the microwave outputted by the resonant structure layer to obtain a first transmission coefficient curve;

making the voltage difference between the first voltage signal and the second voltage signal be greater than or equal to a saturation voltage value of the liquid crystal to be measured, and receiving the microwave outputted by the resonant structure layer to obtain a second transmission coefficient curve; and based on the first transmission coefficient curve, determining a dielectric constant of the liquid crystal corresponding thereto and considering it as a dielectric constant of the liquid crystal in a short axis direction, and based on the second transmission coefficient curve, determining a dielectric constant of the liquid crystal corresponding thereto and considering it as a dielectric constant of the liquid crystal in a long axis direction.

16. The method as claimed in claim 15, wherein the dielectric constant of the liquid crystal in the short axis direction and the dielectric constant of the liquid crystal in the long axis direction are found by using a simulation method, comprising:

establishing a simulation model according to a corresponding measurement experiment model for obtaining the first transmission coefficient curve and the second transmission coefficient curve;

making the voltage difference between the first voltage signal and the second voltage signal in the simulation model be zero and adjusting the dielectric constant of the liquid crystal in the short axis direction in the simulation model, so that an obtained simulation result coincides with the first transmission coefficient curve, and correspondingly the dielectric constant of the liquid crystal in the short axis direction is the dielectric constant of the liquid crystal to be measured in the short axis direction; and making the voltage difference between the first voltage signal and the second voltage signal in the simulation model be greater than or equal to the saturation voltage value of the liquid crystal to be measured and adjusting the dielectric constant of the liquid crystal in the long axis direction in the simulation model, so that the obtained simulation result coincides with the second transmission coefficient curve, and correspondingly the dielectric constant of the liquid crystal in the long axis direction is the dielectric constant of the liquid crystal to be measured in the long axis direction.

17. A measurement system for a dielectric constant of a liquid crystal, wherein the measurement system comprises:

the measuring device for a dielectric constant of a liquid crystal as claimed in claim 1;

a power supply device comprising a first voltage supply port and a second voltage supply port, the first voltage supply port being electrically connected to the conductive layer of the measuring device, the second voltage supply port being electrically connected to the resonant structure layer of the measuring device, the first voltage signal provided by the first voltage port and/or the second voltage signal provided by the second voltage port being adjustable;

a microwave source connected to a microwave signal input end of the resonant structure layer;

a vector network analyzer comprising an input port and an output port, the input port being coupled to the microwave signal input end of the resonant structure layer, the output port being coupled to a microwave signal output end of the resonant structure layer, the vector network analyzer being configured to generate a first transmission coefficient curve in situation where the voltage difference between the first voltage signal and the second voltage signal is zero, and a second transmission coefficient curve in situation where the voltage difference between the first voltage signal and the second voltage signal is greater than or equal to the saturation voltage value of the liquid crystal to be measured.

18. The measurement system as claimed in claim 17, wherein the measurement system further comprises a processor coupled to the vector network analyzer and configured to calculate the dielectric constant of the liquid crystal in a short axis direction corresponding to the first transmission coefficient curve and the dielectric constant of the liquid crystal in a long axis direction corresponding to the second transmission coefficient curve.

* * * * *